(12) United States Patent
Roohparvar (10) Patent No.: US 7,936,608 B2
(45) Date of Patent: May 3, 2011

(54) MEMORY DEVICE OPERATION

(75) Inventor: Frankie F. Roohparvar, Monte Sereno, CA (US)

(73) Assignee: Micron Technology, Inc., Boise, ID (US)

( * ) Notice: Subject to any disclaimer, the term of this patent is extended or adjusted under 35 U.S.C. 154(b) by 127 days.

(21) Appl. No.: 12/489,573

(22) Filed: Jun. 23, 2009

(65) Prior Publication Data

US 2009/0257279 A1    Oct. 15, 2009

Related U.S. Application Data

(62) Division of application No. 11/499,193, filed on Aug. 4, 2006, now Pat. No. 7,551,467.

(51) Int. Cl.
*G11C 11/34* (2006.01)

(52) U.S. Cl. ............... 365/185.18; 365/185.21; 365/203

(58) Field of Classification Search ............. 365/185.18, 365/185.21, 203
See application file for complete search history.

(56) References Cited

U.S. PATENT DOCUMENTS

| | | |
|---|---|---|
| 5,754,482 A | 5/1998 | Su et al. |
| 6,147,910 A | 11/2000 | Hsu et al. |
| 6,243,295 B1 * | 6/2001 | Satoh ................. 365/185.17 |
| 6,307,807 B1 * | 10/2001 | Sakui et al. ............ 365/238.5 |
| 6,751,124 B2 | 6/2004 | Lee |
| 6,870,770 B2 | 3/2005 | Roohparvar |
| 6,974,979 B2 | 12/2005 | Watanabe et al. |
| 6,975,537 B2 * | 12/2005 | Lutze et al. ............ 365/185.18 |
| 6,982,904 B2 | 1/2006 | Shiga |
| 2005/0036395 A1 | 2/2005 | Maejima et al. |
| 2005/0185466 A1 | 8/2005 | Prall |
| 2006/0039197 A1 | 2/2006 | Khouri et al. |

* cited by examiner

*Primary Examiner* — Son T Dinh
(74) *Attorney, Agent, or Firm* — Leffert Jay & Polglaze, P.A.

(57) ABSTRACT

Non-volatile memory devices utilizing a modified NAND architecture where ends of the NAND string of memory cells are selectively coupled to different bit lines may facilitate increased memory densities, reduced fabrication steps and faster read operations when compared to traditional NAND memory array architectures. Programming and erasing of the memory cells can be accomplished in the same manner as a traditional NAND memory array. However, reading of the memory cells may be accomplished using charge sharing techniques similar to read operations in a DRAM device or by using one bit line as a ground node for sensing current flow through the strings. The use of bit lines for virtual grounding is further suitable to other array architectures.

27 Claims, 7 Drawing Sheets

MEMORY DEVICE OPERATION

RELATED APPLICATIONS

This Application is a Divisional of U.S. application Ser. No. 11/499,193, titled "MEMORY DEVICE ARCHITECTURES AND OPERATION," filed Aug. 4, 2006 now U.S. Pat. No. 7,551,467 (Allowed) which is commonly assigned and incorporated herein by reference.

TECHNICAL FIELD

The present invention relates generally to semiconductor memory devices, and in particular, the present invention relates to virtual ground architecture memory devices and their operation and use.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of charge storage or trapping layers or other physical phenomena, determine the data value of each cell. Common uses for flash memory and other non-volatile memory include personal computers, personal digital assistants (PDAs), digital cameras, digital media players, digital recorders, games, appliances, vehicles, wireless devices, cellular telephones, and removable memory modules, and the uses for non-volatile memory continue to expand.

Flash memory typically utilizes one of two basic architectures known as NOR flash and NAND flash. The designation is derived from the logic used to read the devices. In NOR flash architecture, a column of memory cells are coupled in parallel with each memory cell coupled to a bit line. In NAND flash architecture, a column of memory cells are coupled in series with only the first memory cell of the column coupled to a bit line.

As the performance of electronic systems employing flash memory devices increases, flash memory device performance should also increase. A performance increase includes reducing power consumption, increasing speed, and increasing the memory density.

For the reasons stated above, and for other reasons stated below which will become apparent to those skilled in the art upon reading and understanding the present specification, there is a need in the art for alternative NAND memory architectures and their operation.

DETAILED DESCRIPTION

In the following detailed description of the present embodiments, reference is made to the accompanying drawings that form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, electrical or mechanical changes may be made without departing from the scope of the present invention. The following detailed description is, therefore, not to be taken in a limiting sense, and the scope of the present invention is defined only by the appended claims and equivalents thereof.

Non-volatile memory devices are described utilizing a modified NAND architecture where adjacent bit lines cross over each other in an alternating pattern. Ends of the NAND string of memory cells are selectively coupled to different bit lines. Programming and erasing of the memory cells can be accomplished in the same manner as a traditional NAND memory array. However, reading of the memory cells in accordance with embodiments of the invention may be accomplished using charge sharing techniques similar to read operations in a DRAM device or by using one bit line as a ground node for sensing current flow through the strings.

The NAND architectures of the various embodiments include strings of two or more series-coupled field-effect transistor non-volatile memory cells whose data values are determined by their threshold voltages. A first of the series-coupled memory cells of a string is selectively coupled to a first bit line through a first select gate. A last of the series-coupled memory cells of the string is selectively coupled to a second bit line through a second select gate.

Figure 1:
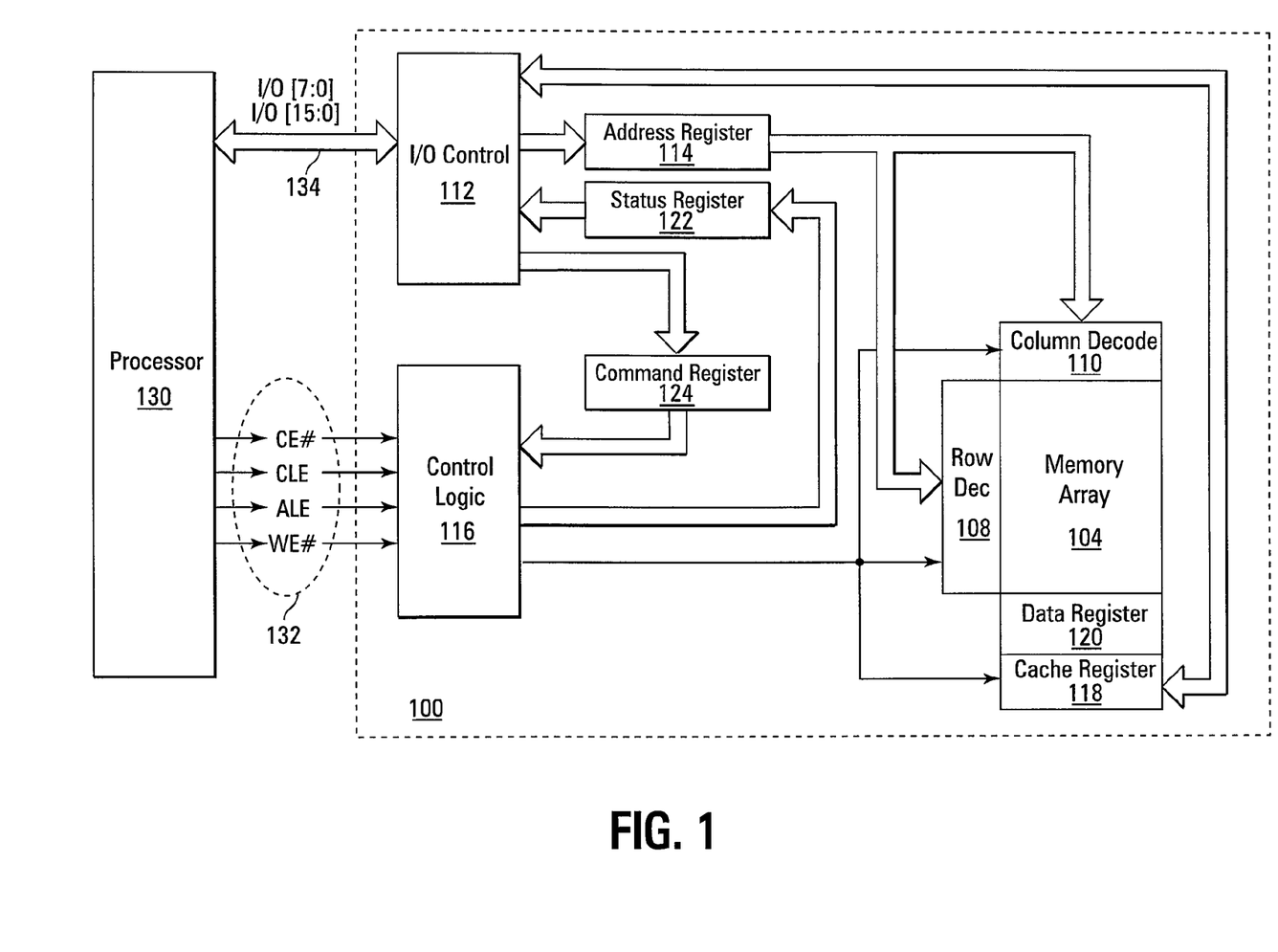
FIG. 1 is a functional block diagram of an electronic system having at least one memory device in accordance with an embodiment of the invention.

FIG. 1 is a simplified block diagram of a NAND flash memory device 100 coupled to a processor 130 as part of an electronic system, according to an embodiment of the invention. Some examples of electronic systems include personal computers, personal digital assistants (PDAs), digital cameras, digital media players, digital recorders, games, appliances, vehicles, wireless devices, cellular telephones and the like. The processor 130 may be a memory controller or other external processor.

Memory device 100 includes an array of memory cells 104 arranged in rows and columns. The array of memory cells 104 has an architecture in accordance with an embodiment of the invention. A row decoder 108 and a column decoder 110 are provided to decode address signals. Address signals are received and decoded to access memory array 104. Memory device 100 also includes input/output (I/O) control circuitry 112 to manage input of commands, addresses and data to the memory device 100 as well as output of data and status information from the memory device 100. An address register 114 is coupled between I/O control circuitry 112 and row decoder 108 and column decoder 110 to latch the address signals prior to decoding. A command register 124 is coupled between I/O control circuitry 112 and control logic 116 to latch incoming commands. Control logic 116 controls access to the memory array 104 in response to the commands and generates status information for the external processor 130. The control logic 116 is coupled to row decoder 108 and column decoder 110 to control the row decoder 108 and column decoder 110 in response to the addresses. Control logic 116 is also coupled to a cache register 118. Cache register 118 latches data, either incoming or outgoing, as directed by control logic 116 to temporarily store data while the memory array 104 is busy writing or reading, respectively, other data. During a write operation, data is passed from the cache register 118 to data register 120 for transfer to the memory array 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is coupled between I/O control circuitry 112 and control logic 116 to latch the status information for output to the processor 130.

Memory device 100 receives control signals at control logic 116 from processor 130 over a control link 132. The control signals may include a chip enable CE#, a command latch enable CLE, an address latch enable ALE, and a write enable WE# in accordance with the present invention. Memory device 100 receives command signals (or commands), address signals (or addresses), and data signals (or data) from processor 130 over a multiplexed input/output (I/O) bus 134 and outputs data to processor 130 over I/O bus 134.

Specifically, the commands are received over input/output (I/O) pins [0:7] of I/O bus 134 at I/O control circuitry 112 and are written into command register 124. The addresses are received over input/output (I/O) pins [0:7] of bus 134 at I/O control circuitry 112 and are written into address register 114. The data are received over input/output (I/O) pins [0:7] for an 8-bit device or input/output (I/O) pins [0:15] for a 16-bit device at I/O control circuitry 112 and are written into cache register 118. The data are subsequently written into data register 120 for programming memory array 104. For another embodiment, cache register 118 may be omitted, and the data are written directly into data register 120. Data are also output over input/output (I/O) pins [0:7] for an 8-bit device or input/output (I/O) pins [0:15] for a 16-bit device. It will be appreciated by those skilled in the art that additional circuitry and control signals can be provided, and that the memory device of FIG. 1 has been simplified to help focus on the invention. Additionally, while the memory device of FIG. 1 has been described in accordance with popular conventions for receipt and output of the various signals, it is noted that the various embodiments are not limited by the specific signals and I/O configurations described unless expressly noted herein.

Figure 2:
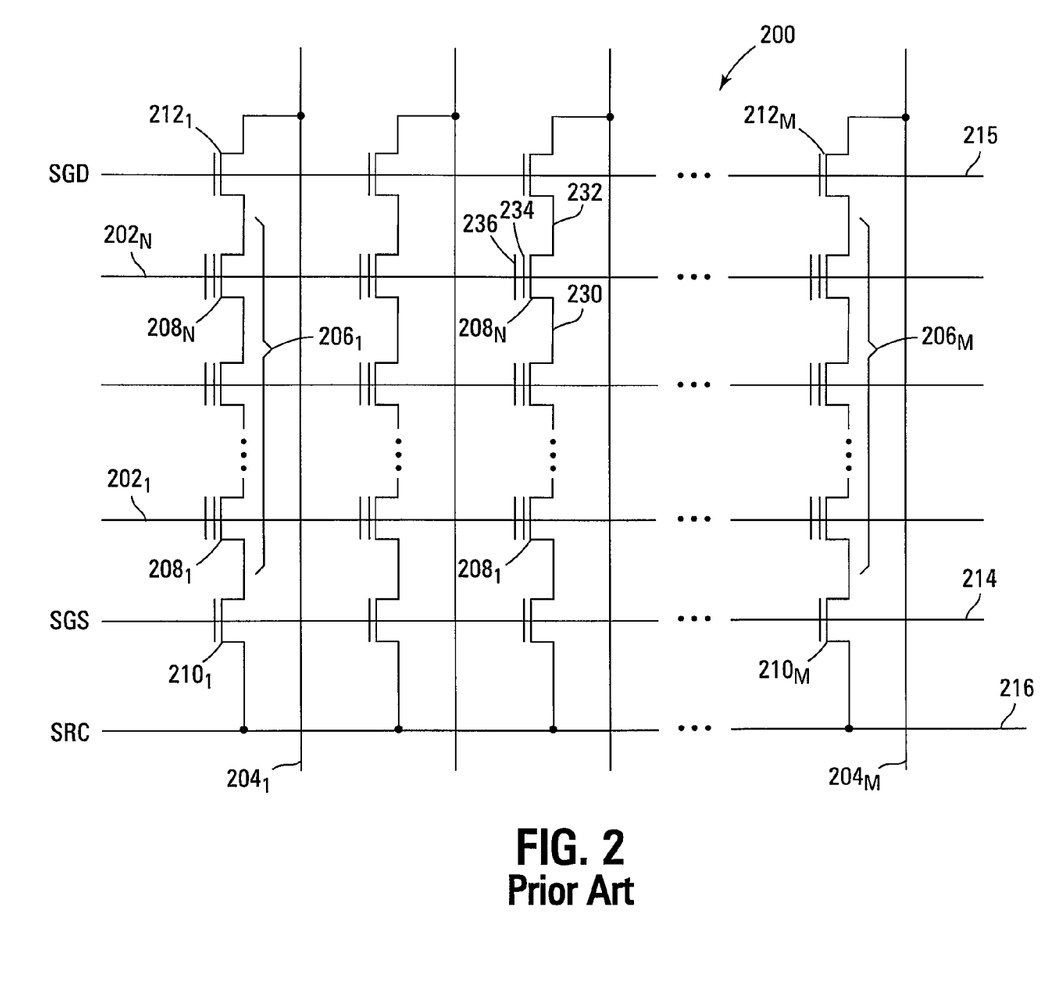
FIG. 2 is a schematic of a portion of an example NAND memory array of the prior art.

FIG. 2 is a schematic of a portion of an example NAND memory array 200 of the prior art included for comparison. As shown in FIG. 2, the memory array 200 includes word lines $202_1$ to $202_N$ and intersecting bit lines $204_1$ to $204_M$. For ease of addressing in the digital environment, the number of word lines 202 and the number of bit lines 204 are generally each some power of two.

Memory array 200 includes NAND strings $206_1$ to $206_M$. Each NAND string includes transistors $208_1$ to $208_N$, each located at an intersection of a word line 202 and a bit line 204. The transistors 208, depicted as floating-gate transistors in FIG. 2, represent non-volatile memory cells for storage of data. The floating-gate transistors 208 of each NAND string 206 are connected in series source to drain between a source select gate 210, e.g., a field-effect transistor (FET), and a drain select gate 212, e.g., a FET. Each source select gate 210 is located at an intersection of a bit line 204 and a source select line 214, while each drain select gate 212 is located at an intersection of a bit line 204 and a drain select line 215.

A source of each source select gate 210 is connected to a common source line 216. The drain of each source select gate 210 is connected to the source of the first floating-gate transistor 208 of the corresponding NAND string 206. For example, the drain of source select gate $210_1$ is connected to the source of floating-gate transistor $208_1$ of the corresponding NAND string $206_1$.

The drain of each drain select gate 212 is connected to a bit line 204 for the corresponding NAND string. For example, the drain of drain select gate $212_1$ is connected to the bit line $204_1$ for the corresponding NAND string $206_1$. The source of each drain select gate 212 is connected to the drain of the last floating-gate transistor 208 of the corresponding NAND string 206. For example, the source of drain select gate $212_1$ is connected to the drain of floating-gate transistor $208_N$ of the corresponding NAND string $206_1$.

Typical construction of floating-gate transistors 208 includes a source 230 and a drain 232, a floating gate 234, and a control gate 236, as shown in FIG. 2. Floating-gate transistors 208 have their control gates 236 coupled to a word line 202. A column of the floating-gate transistors 208 are those NAND strings 206 coupled to a given bit line 204. A row of the floating-gate transistors 208 are those transistors commonly coupled to a given word line 202.

To read memory cells in the prior art NAND architecture memory array of FIG. 2, unselected word lines of a block of memory cells are typically operated as pass gates while a selected word line receives a different control potential to allow its data state to determine the conductance of its associated strings of memory cells. In general, a word line associated with a selected row of memory cells is driven at a selected read level voltage Vread, which is typically a low voltage (such as 0V or ground). In addition, the word lines connected to the gates the unselected memory cells of each string are driven by a pass voltage Vpass (such as 4.5V) to operate the unselected memory cells of each string as pass gates. This allows them to pass current in a manner that is unrestricted by their stored data values. In a read operation, current then flows from the source line to the column bit line through each series-connected string, restricted only by the memory cell selected to be read in each string. The data value of a selected memory cell of a string is then determined by sensing a level of current flow through its associated string.

Figure 3:
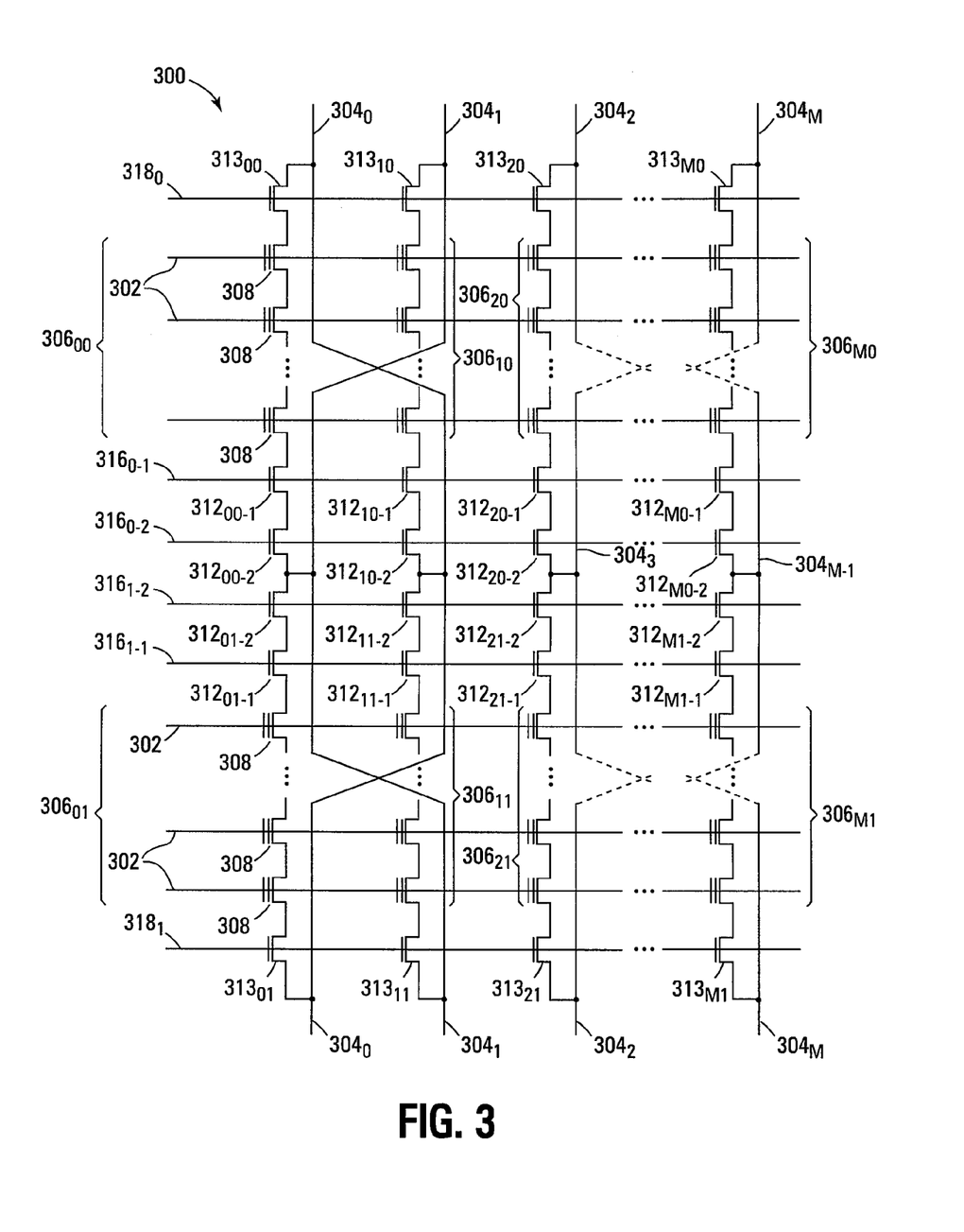
FIG. 3 is a schematic of a portion of a NAND memory array in accordance with an embodiment of the invention.

FIG. 3 is a schematic of a portion of a NAND memory array 300 in accordance with an embodiment of the invention. As shown in FIG. 3, the memory array 300 includes a number of word lines 302 and intersecting bit lines 304 using a layout similar to that of NAND memory array 200. For ease of addressing in the digital environment, the number of word lines 302 and the number of bit lines 304 are generally each some power of two.

Memory array 300 includes NAND strings 306. It is noted that typical memory arrays may contain millions of such strings 306 selectively coupled to bit lines 304 in a many to one relationship. Each NAND string 306 includes a number of field-effect transistors 308, each located at an intersection of a word line 302 and a bit line 304. The transistors 308, depicted as floating-gate transistors in FIG. 3, represent non-volatile memory cells for storage of data. Although the memory array 300 is depicted as an array of floating-gate transistors, other non-volatile memory technologies capable of defining a data value by a change in threshold voltage may also be used, such as NROM, floating-node, ferroelectric, magnetic and the like. Each data value typically corresponds to mutually exclusive ranges of threshold voltages. The floating-gate transistors 308 of each NAND string 306 are connected in series, sharing source/drain regions with adjacent memory cells, between one or more first select gates 312, e.g., a FET, and one or more second select gates 313, e.g., a FET. First select gates 312 are located at an intersection of a bit line 304 and first select line 316, while each second select gate 313 is located at an intersection of a bit line 304 and a second select line 318. Unlike the traditional NAND memory array 200 of FIG. 2, the NAND memory array 300 in accordance with an embodiment of the invention has no select gate coupled to a source line. In contrast, the NAND memory array 300 has both select gates 312 and 313 of a NAND string 306 coupled to a bit line 304.

For FIG. 3, a column of the transistors or memory cells 308 are those NAND strings 306 coupled to a given bit line 304. A row of the transistors or memory cells 308 are those transistors commonly coupled to a given word line 302.

It is generally desirable to program alternating NAND strings 306, e.g., program even strings in a first operation and program odd strings in a second operation. For example, NAND strings $306_{00}$, $306_{20}$ and other even strings may be programmed in a first operation while NAND strings $306_{10}$, $306_{M0}$ and other odd strings are programmed in a second operation. Similarly, it is generally desirable that only NAND strings 306 of one block be programmed concurrently. For example, if even or odd strings of a selected block are being programmed, e.g., even or odd strings of NAND strings $306_{00}$-$306_{M0}$, all strings of other unselected blocks, e.g., NAND strings $306_{01}$-$306_{M1}$, may be inhibited from programming, such as by isolation of one or both ends of its NAND strings $306_{01}$-$306_{M1}$ from bit lines $304_0$-$304_M$.

To permit mutually exclusive coupling of even or odd NAND strings 306, and to permit isolation of unselected blocks, a variety of approaches can be taken. As depicted in FIG. 3, two rows of first select gates 312 are used, with each row of select gates 312 receiving the same control signal through a first select line 316. However, the first select gates 312 of each row alternate between enhancement mode devices, i.e., in a normally deactivated state, and depletion mode devices, i.e., in a normally activated state. The differing device modes may be created by modifying doping levels in alternating devices. For example, as depicted in FIG. 3, first select gate $312_{00-1}$ may be an enhancement mode device while the first select gate $312_{10-1}$ is a depletion mode device. Thus, a supply potential Vcc applied to select line $316_{0-1}$ would activate both first select gates $312_{00-1}$ and $312_{10-1}$ while a ground potential Vss applied to select gate $316_{0-1}$ would deactivate first select gate $312_{00-1}$ and activate first select gate $312_{10-1}$. To allow for selective coupling of either bit line 304 in this example, the second row of first select gates 312 would alternate between enhancement mode and depletion mode devices, but use an opposite pattern from the first row. To continue with this example, first select gate $312_{00-2}$ would be a depletion mode device while first select gate $312_{10-2}$ would be an enhancement mode device. Stated alternately, even select gates of a first row of select gates 312 and odd select gates of a second row of select gates 312 would be enhancement mode devices while odd select gates of the first row of select gates 312 and even select gates of the second row of select gates 312 would be depletion mode devices. Thus, in the example embodiment, a supply potential Vcc applied to select line $316_{0-2}$ would activate both first select gates $312_{00-2}$ and $312_{10-2}$ while a ground potential Vss applied to select line $316_{0-2}$ would activate first select gate $312_{00-2}$ and deactivate first select gate $312_{10-2}$. In this manner, applying the supply potential Vcc to the select line $316_{0-1}$ and the ground potential Vss to select line $316_{0-2}$ would couple NAND string $306_{00}$ to bit line $304_1$ and isolate NAND string $306_{10}$ from bit line $304_0$. Conversely, applying the ground potential Vss to the select line $316_{0-1}$ and the supply potential Vcc to select line $316_{0-2}$ would couple NAND string $306_{10}$ to bit line $304_0$ and isolate NAND string $306_{00}$ from bit line $304_1$. Because the first select gates 312 act in a coordinated manner, a pair of enhancement mode and depletion mode devices associated with a single NAND string 306, e.g., first select gates $312_{00-1}$ and $312_{00-2}$, may be referred to collectively as a first select gate 312, e.g., first select gate $312_{00}$, for purposes of this disclosure. The same use of differing transistor types could be applied to the other end of the NAND strings 306 to achieve additional levels of isolation.

Figure 3A:
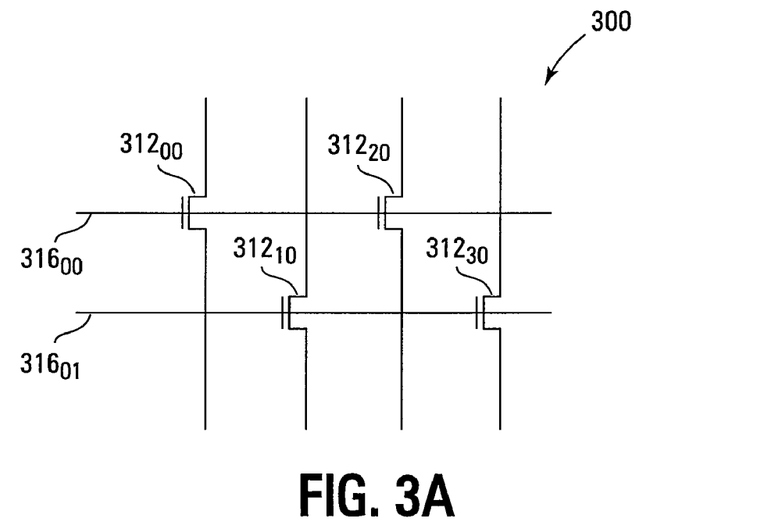
FIG. 3A is a schematic of a portion of a NAND memory array in accordance with another embodiment of the invention.

FIG. 3A is a schematic of a portion of a NAND memory array 300 in accordance with another embodiment of the invention showing a different technique to selectively decouple one NAND string 306 from both of its associated bit lines 304 while an adjacent NAND string 306 is coupled to both of its associated bit lines 304. In the example of FIG. 3A, alternating select gates receive different control signals. For example, even first select gates $312_{00}$ and $312_{20}$ could receive a control signal from select line $316_{00}$ while odd first select gates $312_{10}$ and $312_{30}$ receive a control signal from a different select line $316_{01}$. Remaining structure of the array 300 is as described with reference to FIG. 3. The same use of independent control signals could be applied to the second select gates 313 (not shown in FIG. 3A) to achieve additional levels of isolation.

It may be desirable or necessary to provide for isolation at both ends of each NAND string 306 from the bit lines 304. By applying the ground potential Vss to both select lines $316_{0-1}$ and $316_{0-2}$, or applying a negative control voltage to either select line $316_{0-1}$ or $316_{0-2}$, at least one first select gate 312 would be deactivated for each NAND string 306. While various examples were described to facilitate selective coupling and decoupling of one or both ends of the NAND strings 306 from its associated bit lines 304, other methods could be used to produce the same or substantially similar results.

By eliminating the need for a source and source connection, memory arrays in accordance with embodiments of the invention can be fabricated using less die area and fewer processing steps, thus facilitating increased yield and higher memory densities.

Programming and erasing memory cells 308 of the NAND arrays 300 can be performed similar to programming and erasing memory cells 208 of the prior-art NAND array 200. For example, to program a target floating-gate memory cell 308, i.e., to increase its threshold voltage by adding charge to its floating gate, the word line 302 containing the target memory cell 308 may receive a programming voltage that is some positive potential capable of programming a memory cell in conjunction with the remaining node voltages. For example, the programming voltage may be about 20V. Unselected word lines 302, i.e., word lines 302 not associated with the target memory cell 308, receive some positive potential capable of causing memory cells on the unselected word lines to act as pass gates during the programming of the selected word line. The pass voltage during programming may be about 10V. A selected bit line 304, i.e., one of the bit lines 304 associated with the target memory cell 308 and coupled to its NAND string 306, might receive the ground potential Vss while unselected bit lines 304, e.g., bit lines 304 not associated with or coupled to the target memory cell 308, might receive a higher potential, such as the supply potential Vcc. Note that while this example describes programming only one target memory cell 308, there may be more than one selected bit line 304 as more than one target memory cell 308 on a given word line 302 can be programmed concurrently.

One set of select gates, such as first select gates 312 might receive the same potential as the selected bit lines 304, such as ground potential Vss, on their gates. An opposing set of select gates, such as second select gates 313 might receive some positive potential, such as the supply potential Vcc, on their gates sufficient to activate those select gates coupled to selected bit lines. The bulk substrate in which the memory cells 308 are formed might be held at the ground potential Vss.

Figure 4:
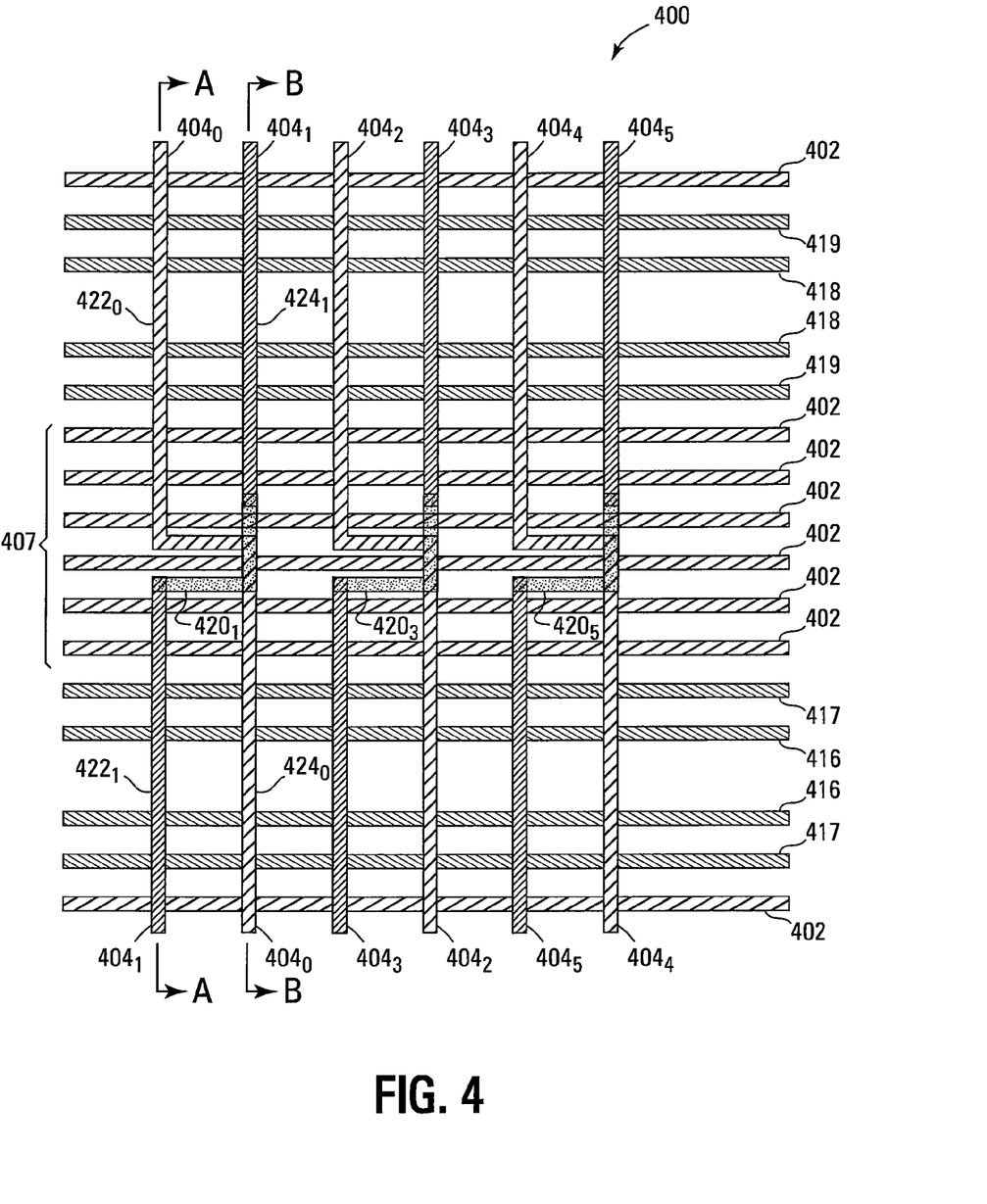
FIG. 4 is a top view of a portion of a NAND memory array in accordance with an embodiment of the invention.

FIG. 4 is a top view of a portion of a NAND memory array 400 in accordance with an embodiment of the invention. The NAND memory array 400 depicts word lines 402 forming memory cells (not separately depicted in FIG. 4), and intersecting bit lines 404. A block of memory cells 407 includes the set of word lines 402 interposed between a first select line 416 and a second select line 418. NAND memory array 400 depicts the use of isolation gates at both ends of a NAND string as first isolation select line 417 interposed between the block of memory cells 407 and the first select line 416, and second isolation select line 419 interposed between the block of memory cells 407 and the second select line 418. Note that the isolation gates need not be interposed between the select lines and the block. For example first select line 416 and first isolation select line 417 could be transposed and/or second select line 418 and second isolation select line 419 could be transposed. Further note that while FIG. 4 depicts six word lines 402 for clarity of the drawing, typical blocks 407 would contain significantly more word lines 402 and would generally contain some number that is a power of two.

Unlike bit lines of a traditional memory array, which would typically be formed as a single straight metal line, the bit lines 404 of the NAND memory array 400 are formed as a series of discontinuous sections. At least one such section has a first leg 422 and a second leg 424 laterally offset from the first leg 422. A second leg 424 of one section of a bit line 404 is coupled to a first leg 422 of a subsequent section of that bit line 404 using a connecting member 420, thus providing continuity among the discontinuous sections of the bit line 404. For example, second leg $424_1$ of one section of bit line $404_1$ is coupled to first leg $422_1$ of a subsequent section of bit line $404_1$. Because the connecting member 420 intersects with a section of the adjacent bit line 404, it is formed at a different level to provide isolation between the adjacent bit lines 404.

Figure 4A:
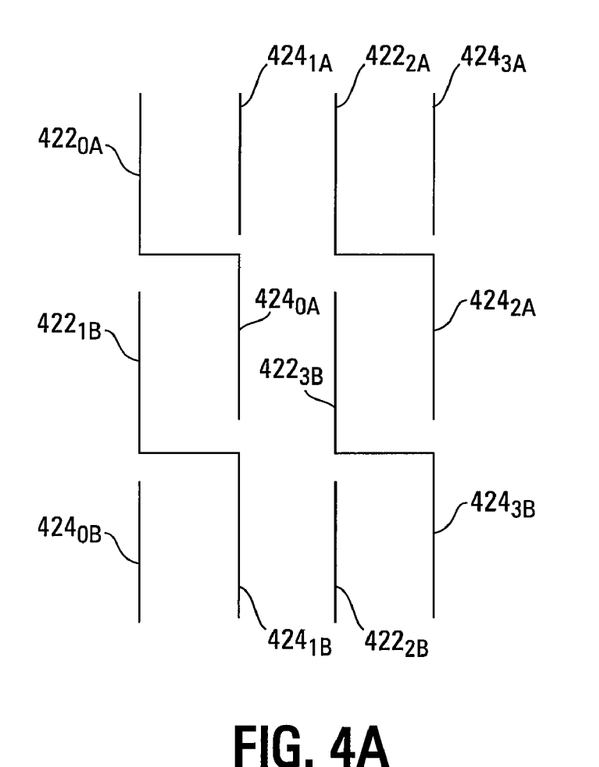
FIG. 4A is a top view of a portion of a NAND memory array bit line layout in accordance with an embodiment of the invention.

FIG. 4A is a top view of a portion of a NAND memory array bit line layout in accordance with an embodiment of the invention. The layout of FIG. 4A provides further detail on how the discontinuous sections of the bit lines 404 formed at one level might be arranged. For clarity, the connecting members 420 and other structures as depicted in FIG. 4 are not shown.

As depicted in FIG. 4A, a first bit line might contain a first discontinuous section having first leg $422_{0A}$ and second leg $424_{0A}$ and a second discontinuous section having only first leg $422_{0B}$ to provide coupling of the first bit line to two NAND strings. A second bit line might contain a first discontinuous section having only second leg $424_{1A}$ and a second discontinuous section having first leg $422_{1B}$ and second leg $424_{1B}$ to provide coupling of the second bit line to two NAND strings. A third bit line might contain a first discontinuous section having first leg $422_{2A}$ and second leg $424_{2A}$ and a second discontinuous section having only first leg $422_{2B}$ to provide coupling of the third bit line to two NAND strings. And a fourth bit line might contain a first discontinuous section having only second leg $424_{3A}$ and a second discontinuous section having first leg $422_{3B}$ and second leg $424_{3B}$ to provide coupling of the fourth bit line to two NAND strings. The first legs 422 for a given bit line may be thought of as those portions of the discontinuous sections selectively coupled to one end of the NAND strings of a column of memory cells while the second legs 424 for that bit line may be thought of as those portions of the discontinuous sections selectively coupled to the opposite end of NAND strings of a different column of memory cells.

Figure 5A:
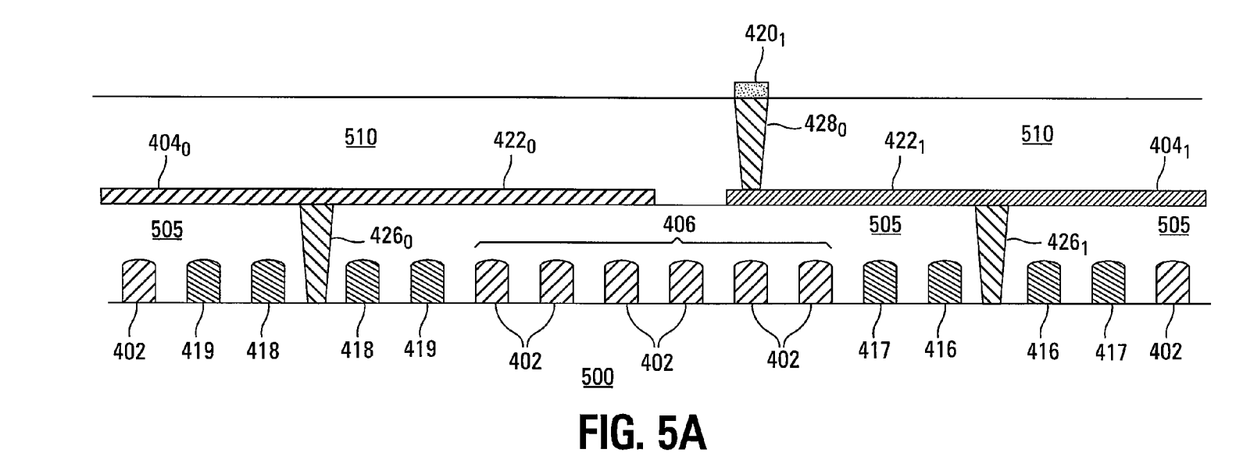
FIGS. 5A-5B are cross-sectional views taken from the NAND memory array of FIG. 4 in accordance with an embodiment of the invention.
Figure 5B:
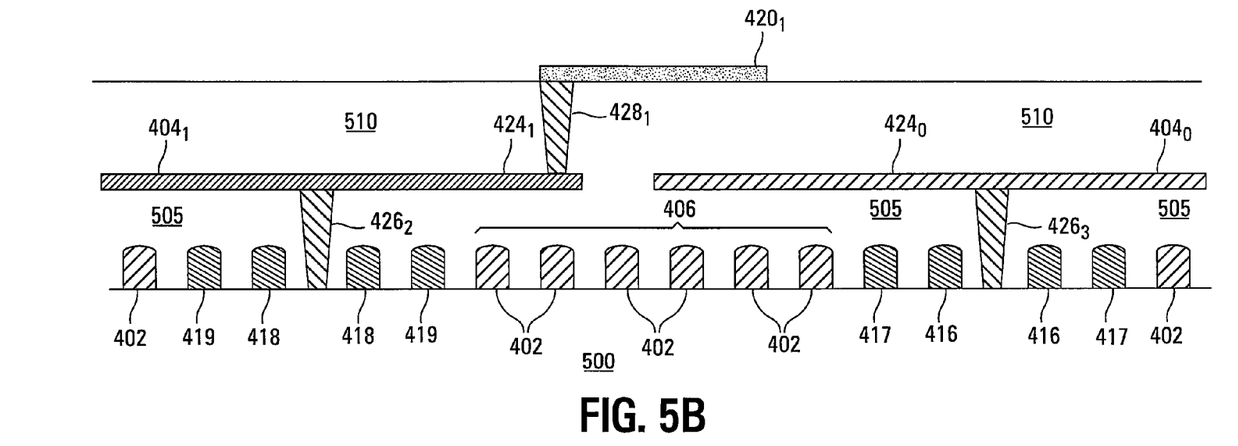

FIGS. 5A-5B are cross-sectional views taken from the NAND memory array 400 of FIG. 4 along lines A-A and B-B, respectively, in accordance with an embodiment of the invention. As depicted in FIG. 5A, word lines 402 and select lines 416-419 are formed on a semiconductor substrate 500. Word lines 402 define memory cells of a NAND string 406. Select lines 416 and 418 form select gates to selectively couple the memory cells of a NAND string 406 to one or both of its associated bit lines $404_0$ and $404_1$. Isolation select lines 417 and 419 form isolation select gates to optionally provide further isolation in selectively coupling the memory cells of a NAND string 406 to one or both of its associated bit lines $404_0$ and $404_1$. Source/drain regions for each of the memory cells, select gates and isolation select gates are formed in the substrate 500 but are not shown for the sake of clarity. However, their function is well understood in the art. Bit lines $404_0$ and $404_1$ are coupled to source/drain regions of their associated select lines 418 and 416, respectively, by conductive contacts $426_0$ and $426_1$, respectively. First leg $422_1$ of bit line $404_1$ is coupled to connecting member $420_1$ by conductive via $428_0$. Continuing with FIG. 5B, connecting member $420_1$ is further coupled to the second leg $424_1$ of bit line $404_1$ by conductive via $428_1$. And bit lines $404_0$ and $404_1$ are coupled to source/drain regions of their associated select lines 416 and 418, respectively, by conductive contacts $426_3$ and $426_2$, respectively.

Formation of the structure as depicted in FIGS. 5A-5B can be performed using standard semiconductor fabrication techniques. For example, after forming word lines 402 and select lines 416-419 on the substrate 500, a bulk dielectric layer 505 could be formed overlying the word lines 402 and select lines 416-419 to provide insulation from subsequent layers. Contact holes would then be formed in the bulk dielectric layer 505 by removing portions of the bulk dielectric layer 505 to expose portions of the substrate 500, and contacts 426 would be formed therein. Sections of the bit lines 404 could then be formed on the bulk dielectric layer 505 in contact with the contacts 426, such as by a blanket deposition of a conductive material, e.g., tungsten, and patterning of the conductive material to define the sections of the bit lines 404. An interlayer dielectric 510 could then be formed overlying the bit lines 404. Via holes would then be formed in the interlayer dielectric 510 by removing portions of the interlayer dielectric 510 to expose portions of the bit lines 404, and vias 428 would be formed therein. Connecting members could then be formed on the interlayer dielectric 510 in contact with the vias 428, such as by a blanket deposition of a conductive material, e.g., aluminum, and patterning of the conductive material to define the connecting members 420. Contacts 426 and vias 428 are often multi-layer constructions to provide adhesion and compatibility to the materials that they couple. However, the various embodiments are not limited by specific material choices. Additionally, while the discontinuous sections of the bit lines 404 containing the first and second legs 422 and 424 are depicted to make up the largest portion of the bit lines 404 with the connecting members 420 merely bridging a second leg 424 of one section with a first leg 422 of a second section, their roles could be transposed. However, as used herein, the connecting member 420 is that portion of a bit line 404 formed to overlie a portion of another bit line 404, regardless of whether it is a minor portion of the bit line 404 or a major portion thereof.

Erasing of memory cells would generally be performed concurrently to a block of memory cells. For example, returning to FIG. 3, to erase the floating-gate memory cells 308, i.e., to decrease their threshold voltages by removing charge from their floating gates, all word lines 302 of a NAND string 306 might receive the ground potential Vss, all bit lines 304 may be electrically floating, and the select lines may be electrically floating while the bulk substrate in which the memory cells 308 are formed is boosted to some erase voltage, such as 20V.

The foregoing represents just one set of techniques for programming and erasing memory cells of a NAND memory array 300 of the type depicted in FIG. 3. It is noted that because typical programming and erase operations do not make use of the source connection of a traditional NAND memory array, many techniques for programming and erasing a traditional NAND memory array 200 can also be applied to NAND memory arrays 300 in accordance with embodiments of the invention. However, because the NAND strings 306 in accordance with embodiments of the invention eliminate the need for a source connection, alternative read operations may be performed with embodiments of the invention.

One method of reading the memory cells 308 of a NAND array 300 in accordance with an embodiment of the invention is to use bit lines 304 as charge storage nodes. In contrast to traditional read operations of NAND memory arrays, such methods rely on capacitance of a bit line during a read operation. A charge is placed on a bit line not containing the target memory cell and then selectively released depending upon the data value stored in the target memory cell. The target memory cell or cells are then read using charge sharing techniques to raise or lower a voltage on their associated bit lines. If the charge has been retained, the associated bit line receives the charge and increases its voltage level. If the charge has been released, the associated bit line loses charge to the storage node bit line and decreases its voltage level. Because no DC current flows through the NAND strings 306 for the read operation, significant power savings can be facilitated over traditional read operations based on current flow. Additionally, the time expected for precharging the strings of memory cells, selectively releasing the charge and reading the data value using charge sharing techniques is expected to be on the order of several hundred nanoseconds versus several microseconds used for traditional conductance read operations. Although not the subject of the present patent application, details of this procedure may be found in U.S. patent application Ser. No. 11/432,135 filed May 11, 2006 and commonly assigned.

Another method of reading the memory cells 308 of a NAND array 300 in accordance with an embodiment of the invention is to use bit lines 304 as virtual grounds. In contrast to traditional read operations of NAND memory arrays, such methods rely on a bit line to act as a ground node during a read operation instead of applying a ground through a separate source line.

In accordance with one embodiment of the invention, a read operation would read memory cells 308 coupled to a selected word line 302 across a number of bit lines 304. For example, a read operation may be performed on every other bit line of a block of memory cells. In such a case, the remaining bit lines could be used as ground nodes during the read operation. For example, if the target memory cell is in NAND string $306_{00}$, the bit line $304_0$ could be read while the bit line $304_1$ acts as a virtual ground.

To read a selected row of memory cells of the NAND memory array 300, the selected word line 302 receives a read voltage to activate its memory cells if they have a first data value, such as a logic 1, and to leave its memory cells deactivated if they have a second data value, such as logic 0. For example, the selected word line 302 might receive the ground potential Vss or 0V. Alternatively, the read voltage may be some value above Vss, such as 0.2V. Other voltages could be used provided they would activate a memory cell having a first data value and not activate a memory cell having a second data value. The selected word line 302 supplies the read voltage to the control gates of each of its memory cells 308. Remaining word lines 302 not containing a selected memory cell 308 may receive a pass voltage to act as pass gates, i.e., activating their memory cells 308 regardless of their data values. For one embodiment, unselected word lines 302 may receive approximately 4.5V. Other voltages could be used provided they would activate each memory cell 308 without regard to its data value. The embodiment will further be described in relation to reading memory cells 308 of even NAND strings 306 having an upper end, e.g., the end near second select gate 313, selectively coupled to even bit lines 304. It will be apparent that similar procedures may be used for reading memory cells 308 of odd NAND strings 306 having an upper end selectively coupled to odd bit lines 304 with appropriate substitutions.

For one embodiment, selected bit lines 304 would receive a bit line voltage while unselected bit lines 304 would receive a ground potential. For example, the selected bit lines 304, i.e., those selectively coupled to an upper end of a NAND string 306 containing a memory cell 308 targeted for reading, might receive 1.0V while unselected bit lines 304, i.e., those selectively coupled to a lower end of a NAND string 306 containing a memory cell 308 targeted for reading, might receive the ground potential Vss. First select gates 312 and second select gates 313 associated with NAND strings 306 containing a memory cell 308 targeted for reading would receive control gate voltages sufficient to activate these select gates. In other words, the NAND strings 306 containing target memory cells would have each end actively coupled to a bit line 304. Remaining NAND strings 306 would have at least one end decoupled from a bit line 304. For example, where even NAND strings $306_{00}$ and $306_{20}$ contain target memory cells 308, they would be actively coupled to bit lines $304_0$/$304_1$ and $304_2$/$304_3$, respectively. Odd NAND strings 306 associated with the same word lines 302 as the even NAND strings $306_{00}$ and $306_{20}$, e.g., NAND strings $306_{10}$ and $306_{M0}$, would be isolated from bit lines $304_0$ and $304_{M-1}$, respectively, by their first select gates $312_{10}$ and $312_{M0}$, respectively. Other NAND strings 306 not associated with the same word lines 302 as the NAND strings $306_{00}$ and $306_{20}$, e.g., NAND strings $306_{01}$-$306_{M1}$, could be isolated at both ends from the bit lines 304 through the use of first select gates $312_{01}$-$312_{M1}$ and second select gates $313_{01}$-$313_{M1}$.

By coupling the selected bit lines 304 to a sensing device, the data value of the target memory cells 308 can be determined. For example, if a target memory cell 308 is activated, a current would flow through its bit line 304. Conversely, if a target memory cell 308 is not activated, significantly less current would flow through its bit line 304. The differential in current levels on the selected bit lines 304 can be used in manners well understood in the art to determine the data value contained in the target memory cell 308 associated with each bit line 304. For example, in reading a target memory cell 308, sensing devices may look for a voltage drop on the selected bit line 304. For example, the selected bit line 304 may be precharged to a bit line voltage, such as 1.0V. When the read voltage is applied to the selected word line 302 and pass voltages are applied to remaining word lines 302 of a NAND strings 306, the bit line 304 will lose charge, and thus voltage, if its target memory cell 308 is activated, but the bit line 304 will maintain its charge if its target memory cell 308 remains deactivated. The data value of the target memory cell 308 is sensed some time after applying the read voltage by looking at the voltage of the bit line 304. The target memory cell 308 is deemed to have a first data value if the bit line 304 falls below some predetermined voltage, e.g., 0.2V, but a second data value if the bit line 304 voltage is higher than the predetermined voltage.

Figure 6:
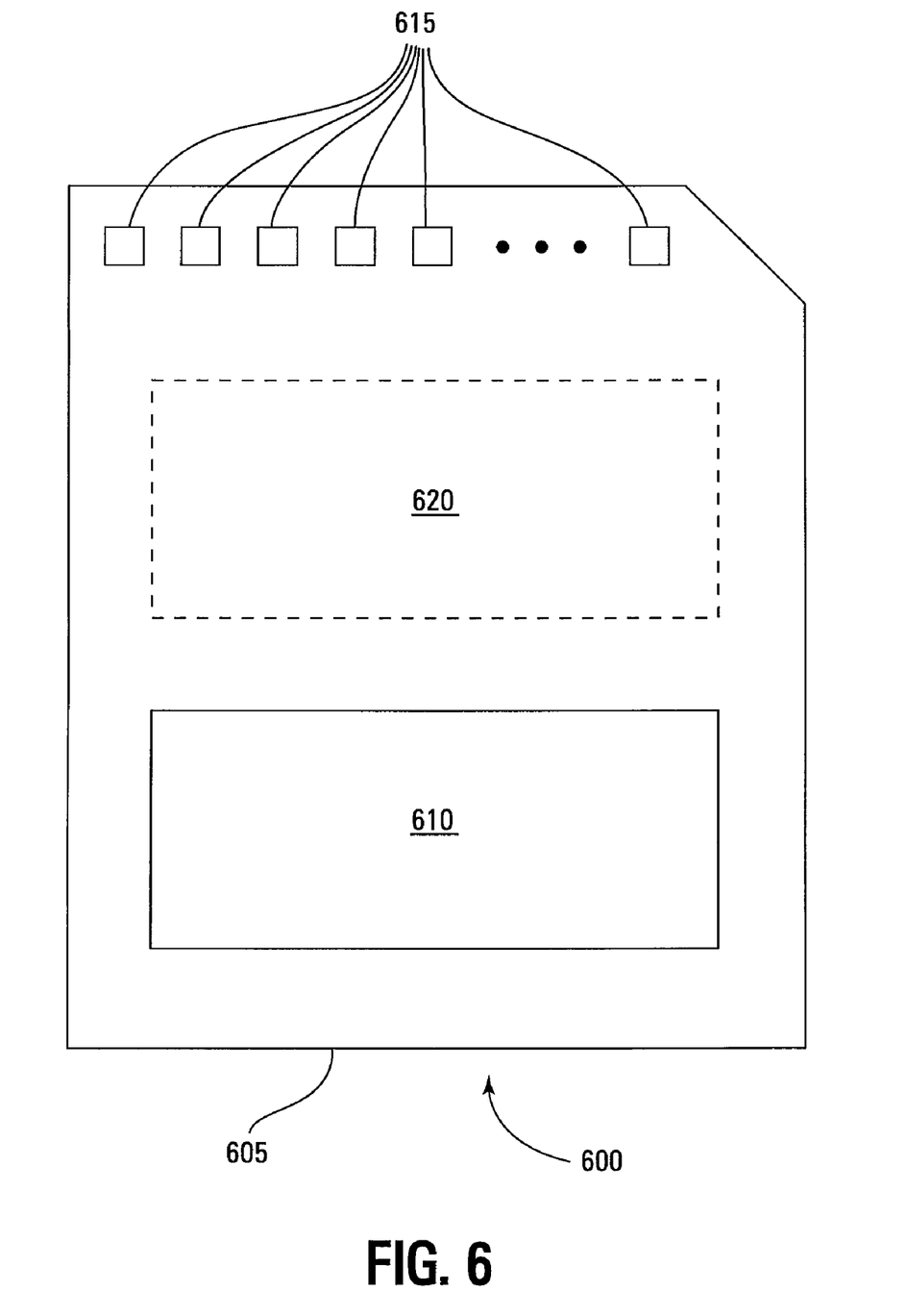
FIG. 6 is a functional block diagram of a memory module having at least one memory device in accordance with an embodiment of the invention.

FIG. 6 is an illustration of an exemplary memory module 600. Memory module 600 is illustrated as a memory card, although the concepts discussed with reference to memory module 600 are applicable to other types of removable or portable memory, e.g., USB flash drives, and are intended to be within the scope of "memory module" as used herein. In addition, although one example form factor is depicted in FIG. 6, these concepts are applicable to other form factors as well.

In some embodiments, memory module 600 will include a housing 605 (as depicted) to enclose one or more memory devices 610, though such a housing is not essential to all devices or device applications. At least one memory device 610 is a non-volatile memory having a NAND architecture in accordance with an embodiment of the invention. Where present, the housing 605 includes one or more contacts 615 for communication with a host device. Examples of host devices include personal computers, PDAs, digital cameras, digital media players, digital recorders, games, appliances, vehicles, wireless devices, cellular telephones, memory card readers, interface hubs and the like. For some embodiments, the contacts 615 are in the form of a standardized interface. For example, with a USB flash drive, the contacts 615 might be in the form of a USB Type-A male connector. For some embodiments, the contacts 615 are in the form of a semi-proprietary interface, such as might be found on Compact-Flash™ memory cards licensed by SanDisk Corporation, Memory Stick™ memory cards licensed by Sony Corporation, SD Secure Digital™ memory cards licensed by Toshiba Corporation and the like. In general, however, contacts 615 provide an interface for passing control, address and/or data signals between the memory module 600 and a host having compatible receptors for the contacts 615.

The memory module 600 may optionally include additional circuitry 620 which may be one or more integrated circuits and/or discrete components. For some embodiments, the additional circuitry 620 may include a memory controller for controlling access across multiple memory devices 610 and/or for providing a translation layer between an external host and a memory device 610. For example, there may not be a one-to-one correspondence between the number of contacts 615 and a number of I/O connections to the one or more memory devices 610. Thus, a memory controller could selectively couple an I/O connection (not shown in FIG. 6) of a memory device 610 to receive the appropriate signal at the appropriate I/O connection at the appropriate time or to provide the appropriate signal at the appropriate contact 615 at the appropriate time. Similarly, the communication protocol between a host and the memory module 600 may be different than what is required for access of a memory device 610. A memory controller could then translate the command sequences received from a host into the appropriate command sequences to achieve the desired access to the memory device 610. Such translation may further include changes in signal voltage levels in addition to command sequences.

The additional circuitry 620 may further include functionality unrelated to control of a memory device 610 such as logic functions as might be performed by an ASIC (application specific integrated circuit). Also, the additional circuitry 620 may include circuitry to restrict read or write access to the memory module 600, such as password protection, biometrics or the like. The additional circuitry 620 may include circuitry to indicate a status of the memory module 600. For example, the additional circuitry 620 may include functionality to determine whether power is being supplied to the memory module 600 and whether the memory module 600 is currently being accessed, and to display an indication of its status, such as a solid light while powered and a flashing light while being accessed. The additional circuitry 620 may further include passive devices, such as decoupling capacitors to help regulate power requirements within the memory module 600.

CONCLUSION

Virtual ground memory array architectures using bit lines as a ground node have been described. As one example of such virtual ground memory array architectures, NAND memory array architectures having series-coupled strings of non-volatile memory cells where ends of the string are selectively coupled to different bit lines, and methods of reading a NAND memory array using a bit line as a ground node, have further been described. Such methods and apparatus can facilitate increased memory densities, reduced fabrication steps and faster read operations when compared to traditional NAND memory array architectures.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. For example, while the example embodiments addressed NAND memory arrays, other array architectures utilizing strings of memory cells could benefit from the virtual ground structures and techniques described herein. Accordingly, this application is intended to cover any adaptations or variations of the invention. It is manifestly intended that this invention be limited only by the following claims and equivalents thereof.

What is claimed is:

1. A method of operating a non-volatile memory device having at least one string of series-coupled non-volatile memory cells, the method comprising:
    applying a first potential to a first bit line selectively coupled to a first target memory cell of a first string of series-coupled non-volatile memory cells;
    applying a second potential to a second bit line selectively coupled to the first target memory cell;
    selectively activating the first target memory cell dependent upon its data value;
    activating other memory cells of the first string of series-coupled non-volatile memory cells regardless of the data values;

actively coupling the first and second bit lines to the first target memory cell; and determining the data value of the first target memory cell in response to a level of current flow through the first string of series-coupled non-volatile memory cells.

2. The method of claim 1, wherein the first potential has a value greater than the second potential.

3. The method of claim 1, wherein actively coupling the first and second bit lines to the first target memory cell comprises activating a first select gate coupled between the first bit line and the first string of series-coupled non-volatile memory cells and activating a second select gate coupled between the second bit line and the first string of series-coupled non-volatile memory cells, respectively.

4. The method of claim 3, further comprising actively decoupling at least one of the first and second bit lines from a second string of series-coupled non-volatile memory cells, wherein the second string of series-coupled non-volatile memory cells is selectively coupled between the first and second bit lines and wherein the second string of series-coupled non-volatile memory cells is adjacent the first string of series-coupled non-volatile memory cells.

5. The method of claim 4, wherein actively decoupling at least one of the first and second bit lines from a second string of series-coupled non-volatile memory cells comprises actively decoupling at least one of the first and second bit lines from the second string of series-coupled non-volatile memory cells using control signals selected from the group consisting of a same set of controls signals used for actively coupling the at least one of the first and second bit lines to the first string of series-coupled non-volatile memory cells and a set of control signals having at least one control signal different than control signals used for actively coupling the at least one of the first and second bit lines to the first string of series-coupled non-volatile memory cells.

6. The method of claim 4, wherein actively decoupling at least one of the first and second bit lines from a second string of series-coupled non-volatile memory cells comprises actively decoupling only one of the first and second bit lines from the second string of series-coupled non-volatile memory cells while actively coupling a remaining one of the first and second bit lines to the second string of series-coupled non-volatile memory cells.

7. The method of claim 3, wherein at least one of the first and second select gates comprises a first enhancement mode device and a first depletion mode device coupled in series between its respective bit line and the first target memory cell, and wherein activating the at least one of the first and second select gate comprises activating the first enhancement mode device in response to a first control signal and activating the first depletion mode device in response to a second control signal.

8. The method of claim 7, further comprising deactivating a second enhancement mode device in response to the second control signal and deactivating a second depletion more device in response to the first control signal, wherein the second enhancement mode device and the second depletion mode device are coupled in series between a particular bit line and one end of a second string of series-coupled non-volatile memory cells, wherein the particular bit line is the second bit line when the at least one of the first and second select gates is the first select gate, and wherein the particular bit line is the first bit line when the at least one of the first and second select gates is the second select gate.

9. The method of claim 1, further comprising:

applying the first potential to the second bit line, wherein the second bit line is further selectively coupled to a second target memory cell of a second string of series-coupled non-volatile memory cells;

applying the second potential to the first bit line, wherein the first bit line is further selectively coupled to the second target memory cell;

selectively activating the second target memory cell dependent upon its data value;

activating other memory cells of the second string of series-coupled non-volatile memory cells regardless of the data values;

actively coupling the first and second bit lines to the second target memory cell; and determining the data value of the second target memory cell in response to a level of current flow through the second string of series-coupled non-volatile memory cells.

10. The method of claim 9, wherein the second string of series-coupled non-volatile memory cells is adjacent the first string of series-coupled non-volatile memory cells.

11. A method of operating a non-volatile memory device having at least two NAND strings of non-volatile memory cells, the method comprising:

precharging a first bit line to a first potential, wherein the first bit line is selectively coupled to a first end of a first NAND string of non-volatile memory cells containing a first target memory cell and selectively coupled to a second end of a second NAND string of non-volatile memory cells;

applying a second potential to a second bit line, wherein the second bit line is selectively coupled to a second end of the first NAND string of non-volatile memory cells containing the first target memory cell and selectively coupled to a first end of the second NAND string of non-volatile memory cells; and sensing a data value of the first target memory cell from a voltage change in the first bit line.

12. The method of claim 11, wherein the first potential is greater than the second potential.

13. The method of claim 11, wherein sensing a data value of the first target memory cell further comprises:

actively coupling the first bit line and the second bit line to the first target memory cell and applying a control voltage to the first target memory cell adapted to activate the first target memory cell if it has a first data value and to deactivate the first target memory cell if it has a second data value; and isolating at least the first bit line from the second NAND string of non-volatile memory cells.

14. The method of claim 13, further comprising isolating the second bit line from the second NAND string of non-volatile memory cells while sensing the data value of the first target memory cell.

15. The method of claim 13, wherein actively coupling the first bit line and the second bit line to the first target memory cell further comprises applying a control voltage to remaining memory cells of the first NAND string of non-volatile memory cells adapted to activate the remaining memory cells regardless of their data values, and applying a control voltage to any select gates or isolation gates interposed between the memory cells and either bit line that is adapted to activate those select gates or isolation gates.

16. The method of claim 11, wherein after sensing the data value of the first target memory cell, the method further comprises:

precharging the second bit line to the first potential;

applying the second potential to the first bit line; and sensing a data value of a second target memory cell of the second NAND string of non-volatile memory cells from a voltage change in the second bit line.

17. The method of claim 16, wherein sensing a data value of the second target memory cell further comprises:
   actively coupling the first bit line and the second bit line to the second target memory cell and applying a control voltage to the second target memory cell adapted to activate the second target memory cell if it has the first data value and to deactivate the second target memory cell if it has the second data value; and
   isolating at least the second bit line from the first NAND string of non-volatile memory cells.

18. The method of claim 17, wherein actively coupling the first bit line and the second bit line to the second target memory cell further comprises applying a control voltage to remaining memory cells of the second NAND string of non-volatile memory cells adapted to activate the remaining memory cells of the second NAND string of non-volatile memory cells regardless of their data values, and applying a control voltage to any select gates or isolation gates interposed between those memory cells and either bit line that is adapted to activate those select gates or isolation gates.

19. The method of claim 18, wherein a control voltage adapted to activate a select gate interposed between memory cells of the second NAND string of non-volatile memory cells and a bit line is further adapted to deactivate a select gate interposed between memory cells of the first NAND string of non-volatile memory cells and that bit line.

20. A method of operating a memory device having one or more of pairs of NAND strings of non-volatile memory cells, the method comprising:
   applying a first potential to a first bit line selectively coupled to a first end of a first NAND string of a pair of NAND strings, the first NAND string having a target memory cell;
   applying a second potential to a second bit line selectively coupled to a first end of a second NAND string of the pair of NAND strings and selectively coupled to a second end of the first NAND string; and
   sensing a data state of the target memory cell in response to the application of the first potential and the second potential;
   wherein the first bit line is further selectively coupled to a second end of the second NAND string of the pair of NAND strings.

21. The method of claim 20, wherein applying the second potential to the second bit line further comprises applying the second potential to the second bit line where the second potential is a ground potential.

22. The method of claim 21, wherein sensing the data state of the target memory cell further comprises sensing current flow present in the first NAND string.

23. The method of claim 22, wherein sensing the data state of the target memory cell further comprises sensing the data state of the target memory cell by biasing a control gate of the target memory cell with a potential adapted to selectively activate the target memory cell dependent upon its data state and biasing control gates of remaining memory cells of the first string of memory cells with potentials adapted to activate the remaining memory cells regardless of their data states.

24. The method of claim 20, further comprising actively coupling the first NAND string to the first bit line wherein actively coupling the first NAND string comprises activating a first select gate coupled between the first end of the first NAND string and the first bit line.

25. The method of claim 24, further comprising deactivating a second select gate coupled between the first end of the second NAND string and the second bit line while activating the first select gate coupled between the first end of the first NAND string to and the first bit line.

26. The method of claim 25, further comprising activating a third select gate coupled between the second end of the first NAND string and the second bit line and deactivating a fourth select gate coupled between the second end of the second NAND string and the first bit line while activating the first select gate coupled between the first end of the first NAND string to and the first bit line.

27. The method of claim 20, wherein applying the second potential to the second bit line further comprises applying the second potential to the second bit line where the second potential is less than the first potential.

* * * * *